United States Patent [19]

Seifert

[11] 4,358,683
[45] Nov. 9, 1982

[54] INSTALLATION FOR DETERMINING THE TEMPERATURE OF THE HEATER COIL OF AN X-RAY TUBE

[75] Inventor: Gerd Seifert, Spardorf, Fed. Rep. of Germany

[73] Assignee: Siemens Aktiengesellschaft, Berlin & Munich, Fed. Rep. of Germany

[21] Appl. No.: 203,534

[22] Filed: Nov. 3, 1980

[30] Foreign Application Priority Data

Dec. 7, 1979 [DE] Fed. Rep. of Germany ....... 2949331

[51] Int. Cl.³ .......................... H05G 1/26; G01K 7/16; G01K 13/00
[52] U.S. Cl. ..................................... 378/101; 315/94; 315/107
[58] Field of Search ................ 250/409, 408; 315/107, 315/94

[56] References Cited

U.S. PATENT DOCUMENTS 1,266,570 5/1918 Farnsworth ...................... 324/65 R
4,295,049 10/1931 Ebersberger et al. .............. 250/409

FOREIGN PATENT DOCUMENTS 1062831 8/1967 Fed. Rep. of Germany .

OTHER PUBLICATIONS

Keskimaki, C. A., "Dynamic Resistance Spot Weld Analyzer", Western Electric Technical Digest, No. 46, Apr. 1977, pp. 21 & 22.

Primary Examiner—Eugene La Roche
Assistant Examiner—T. N. Grigsby
Attorney, Agent, or Firm—Hill, Van Santen, Steadman, Chiara & Simpson

[57] ABSTRACT

In the exemplary embodiment the temperature-dependent resistance of the cathode coil is taken as the measure of the instantaneous coil temperature and is employed for the purpose of dimensioning an increased filament power in the transition time between fluoroscopy and radiography, or for the purpose of dimensioning a heating pause in the transition time between radiography and fluoroscopy, respectively.

4 Claims, 1 Drawing Figure

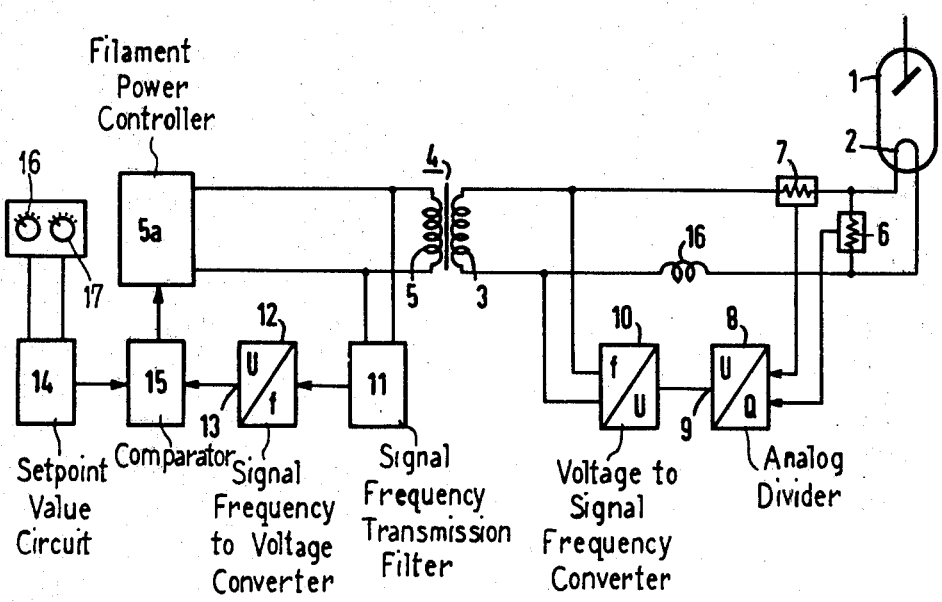

INSTALLATION FOR DETERMINING THE TEMPERATURE OF THE HEATER COIL OF AN X-RAY TUBE

BACKGROUND OF THE INVENTION

The invention relates to an installation for determining the temperature of the heater coil of an x-ray tube.

X-ray tubes are employed in x-ray diagnostics for fluoroscopy or radiography. In the case of some examination techniques, one must be able to rapidly alternate from fluoroscopy to radiography. Radiography is only then possible when some control functions are executed. One of these necessary control functions is, after selection of the heater coil of the x-ray tube necessary for radiography, the production of a high emission temperature of this coil.

If a switch-over is effected from fluoroscopy to radiography, the following occurs, among other things: The fluoroscopy x-ray tube voltage is disconnected (or switched off). The coil which, corresponding to the low fluoroscopy x-ray tube current, was only somewhat heated, is heated to the radiography temperature. As soon as it has assumed this temperature, the radiography x-ray tube voltage is permitted to be connected.

In the case of x-ray tubes comprising two heater coils, during the changeover from fluoroscopy to radiography, also the coil can be changed. Here, the radiography coil must then be heated from a temperature, at which it just barely did not yet emit, to radiography temperature. This operation lasts up to one second and can determine the transition time between fluoroscopy and radiography. It lasts particularly long when the filament power, with which electronic heating is effected, is not substantially greater than the filament power, with which the emission temperature is maintained.

Thus, in the interest of a short transition time from fluoroscopy operation to radiography operation, it is of importance to supply increased power to the coil for a time interval until it has the desired radiography temperature.

In the interest of a short transition time from radiography operation to fluoroscopy operation, it is analogously of importance to supply no power to the coil for a time interval until it has the desired fluoroscopy temperature.

The increased power or the heating pause can be allocated to the coil by a controlled heating circuit or by a closed loop regulated heating circuit.

A controlled (open loop) heating circuit can be improved if one measures the coil temperature and utilizes it as a dimensioning quantity.

In contrast to a controlled heating circuit, a closed loop regulated heating circuit, by definition, has an actual value determination (or detection). Such a regulated heating circuit would supply to the coil increased filament power for a length of time until the determined actual value, which reproduces the heating coil temperature, has attained a desired setpoint value which a memory in the heating circuit supplies when addressed with the radiography parameters: x-ray tube current and x-ray tube voltage.

Conversely, a closed loop regulated heating circuit would not supply any filament power to the coil in the transition time from photography to fluoroscopy for such a length of time until the actual value, which represents the heating coil temperature, has attained the desired value, which the memory communicates (or signals) as necessary for the fluoroscopy operation.

SUMMARY OF THE INVENTION

The object underlying the invention resides in producing an installation for determining the temperature of the heating coil of an x-ray tube, which is applicable in conjunction with the above-described heating circuits, which thus permits the supply of an additional energy pack to the heating coil during the electronic heating time, in which the respectively present heating coil temperature is taken into account and which permits the insertion, in the transition time from radiography to fluoroscopy, of such a heating pause in which the respectively present heating coil temperature is likewise taken into account.

In accordance with the invention this object is achieved by means for measuring the coil resistance and for forming a corresponding electric signal. This electric signal, which is obtained by means of a very simply constructed and reliable installation, is utilized for control of the additional energy pack during the electronic heating time.

If these means for measuring the coil resistance lie in the secondary circuit of the filament transformer, it is possible to convert this signal reproducing the temperature of the heating coil into a corresponding frequency which is transmitted via the filament transformer to its primary side, and is there filtered out by means of a filter and converted into a corresponding voltage.

The determination of the coil resistance as a measure of the coil temperature, in addition, has the advantage that the increase in the coil resistance, which accompanies the coil aging, is interpreted by the heating circuit as an increased temperature and thus leads to a gentle heating of the coil which has already become thinner.

The invention shall be explained in greater detail in the following on the basis of an exemplary embodiment illustrated on the accompanying drawing sheet; and other objects, features and advantages will be apparent from this detailed disclosure and from the appended claims.

BRIEF DESCRIPTION OF THE DRAWING

The single FIGURE shows an electric circuit diagram of an exemplary embodiment of the present invention.

DETAILED DESCRIPTION

In the drawing an x-ray tube 1 is illustrated whose heating coil 2 is fed by the secondary winding 3 of a filament transformer 4. The primary winding 5 of the filament transformer 4 is connected to a supply installation 5a by means of which the filament power is determined.

In order to determine the temperature of the heating coil 2, a signal corresponding to the heating coil voltage is tapped from a shunt resistance 6 which is connected in parallel with the heating coil 2, and a signal corresponding to the heating coil current is tapped at a series resistance 7. These two signals are supplied to a divider unit 8 which divides the voltage by the current and hence delivers a signal corresponding to the coil resistance at its output 9. This output signal of the divider circuit 8, connected at its input side with the secondary circuit of the filament transformer 4, is supplied to a voltage-to-frequency converter which supplies to the secondary winding 3 of the filament transformer 4 a signal frequency which corresponding to the coil resistance. This signal frequency is filtered out by a filter 11 on the primary side of the filament transformer, and supplied to a frequency-to-voltage converter 12 which supplies a voltage to a comparator 15 at its output 13 which voltage corresponds to the actual value of the resistance of the heating coil 2.

An unnecessary loading of the output of the converter 10 by heating coil 2 is prevented by an inductance 16 which is selected to block the signal frequency range supplied by converter 10.

Since a known correlation (or relation) exists between the resistance and the temperature of the heating coil of tube 1, it is possible to infer the resistance of the heating coil 2 from the output signal of the frequency-to-voltage converter 12.

The resistance measurement proceeds, in the illustrated exemplary embodiment, in the secondary circuit of the filament transformer 4 at cathode potential. The signal from the comparator 15 is employed as the controlling input to filament power controller 5a only during the electronic heating time, or during the transition time between radiography and fluoroscopy, respectively. During fluoroscopy and during radiography different sensor and control loops (or automatic control circuits) in the x-ray generator influence the heating of the cathode coil. In a further embodiment of the invention, a memory of the setpoint value circuit 14 which stores the radiographic exposure values can be so designed that it remembers the output signals of the converter 12 during fluoroscopy operation, or radiography operation, respectively, as being associated with the radiographic parameters and then puts them out as setpoint values during later transition times. In a simpler version of this further embodiment, desired setpoint values corresponding to the outputs from converter 12 during fluoroscopy and radiography can be manually selected by means of adjustment knobs 16 and 17, such setpoint values serving as reference values for comparator 15 during transition times from radiography to fluoroscopy, and from fluoroscopy to radiography, respectively.

It will be apparent that many modifications and variations may be effected without departing from the scope of the novel concepts and teachings of the present invention.

I claim:

1. An installation for determining the temperature of the heating coil of an x-ray tube, characterized by means (6, 7, 8) for measuring the coil resistance and for forming a corresponding electric signal, and a memory (14) for storing setpoint values which are a function of coil resistances measured during fluoroscopy and radiography and for supplying said setpoint values in the transition times between fluoroscopy and radiography.

2. An installation for determining the temperature of the heating coil of an x-ray tube, characterized by means (6, 7, 8) for measuring the coil resistance and for forming a corresponding electric signal, and further including a filament power controller (5a), said means (6, 7, 8) for measuring the coil resistance being connected to said filament power controller (5a) for influencing the filament power supplied to the heating coil (2).

3. In an x-ray system, an x-ray tube (1) having a filament heating coil (2); a filament transformer (4) having a primary circuit for coupling with a filament power supply and having a secondary circuit for supplying filament heating current to the filament heating coil (2);

means for measuring the resistance of the heating coil (2), comprising measurement means (6, 7) coupled with said heating coil (2) for supplying first and second signals in accordance with the voltage across the heating coil, and in accordance with the current flowing in the heating coil, and a divider (8) coupled with said measurement means (6, 7) and operable for supplying a quotient signal in accordance with the quotient of said first and second signals;

a voltage-to-frequency converter (10) having a converter input coupled with said divider (8) and having a converter output coupled with said secondary circuit of said filament transformer, and being operable to supply a signal frequency to said secondary circuit in accordance with said quotient signal; a filter (11) coupled with the primary circuit for the transmission of said signal fequency; and a frequency-to-voltage converter (12) coupled with said secondary circuit via said filter and operable for supplying an output signal in accordance with said signal frequency, as a measure of the temperature of said heating coil.

4. An x-ray system according to claim 3, with a setpoint value circuit (14) for supplying setpoint values in accordance with the output signals from said frequency-to-voltage converter (12) during fluoroscopy and during radiography, a filament power controller (5a), and a comparator (15) having respective inputs coupled with said frequency-to-voltage converter (12) and with said setpoint value circuit (14) and having its output coupled with said filament power controller (5a).

* * * * *